US010366713B1

(12) United States Patent
Tang et al.

(10) Patent No.: US 10,366,713 B1
(45) Date of Patent: Jul. 30, 2019

(54) DESIGNS FOR MULTIPLE PERPENDICULAR MAGNETIC RECORDING (PMR) WRITERS AND RELATED HEAD GIMBAL ASSEMBLY (HGA) PROCESS

(71) Applicant: Headway Technologies, Inc., Milpitas, CA (US)

(72) Inventors: Yuhui Tang, Milpitas, CA (US); Moris Dovek, San Jose, CA (US); Wenjie Chen, Cupertino, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 15/912,821

(22) Filed: Mar. 6, 2018

(51) Int. Cl.
| | | |
|---|---|---|
| G11B 5/39 | (2006.01) | |
| G11B 5/596 | (2006.01) | |
| G01R 31/28 | (2006.01) | |
| G11B 5/012 | (2006.01) | |
| B24B 37/04 | (2012.01) | |
| G11B 5/02 | (2006.01) | |

(52) U.S. Cl.
CPC .............. G11B 5/39 (2013.01); B24B 37/048 (2013.01); G01R 31/2803 (2013.01); G11B 5/012 (2013.01); G11B 5/02 (2013.01); G11B 5/59605 (2013.01)

(58) Field of Classification Search
CPC .. G11B 5/39; G11B 5/012; G11B 5/02; B24B 37/048; G01R 31/2803
USPC ............................................... 360/234–234.7
See application file for complete search history.

(56) References Cited

U.S. PATENT DOCUMENTS

| | | | |
|---|---|---|---|
| 6,665,136 B2 | 12/2003 | Clinton et al. | |
| 7,633,711 B2 | 12/2009 | Hsiao et al. | |
| 7,907,360 B2 | 3/2011 | Mak et al. | |
| 7,936,646 B2 | 5/2011 | McCormack et al. | |
| 8,009,403 B1 | 8/2011 | Mallary et al. | |
| 8,218,264 B1 | 7/2012 | Sasaki et al. | |
| 8,274,758 B2 | 9/2012 | Wu et al. | |
| 8,593,764 B1 * | 11/2013 | Tian ..................... | G11B 5/4853 360/245.4 |

(Continued)

OTHER PUBLICATIONS

Co-pending U.S. Appl. No. 15/942,640, filed Apr. 2, 2018, by Kowand Liu et al., "Magnetic Core and Coil Design for Double Perpendicular Magnetic Recording (PMR) Writers," 50 pgs.

(Continued)

*Primary Examiner* — Allen T Cao
(74) *Attorney, Agent, or Firm* — Saile Ackerman LLC; Stephen B. Ackerman

(57) ABSTRACT

A pad/trace line layout for a PMR writer structure having two or more writers on a slider, and a process for selecting the best of the multiple writers is disclosed. Each writer is individually probed with a spin stand test device to generate performance results including bit error rate (BER), and area density capability (ADC). After the best writer is determined, the slider is integrated in a HGA. Only the best writer is connected through trace lines to a preamp to enable functionality. At least one trace line has a plurality of arms that enable flexibility in connecting the best writer to the preamp while other arms are not connected. In some embodiments, all writers share a common W– pad that is connected to the preamp through one of two trace lines while the other trace line has one of the plurality of arms connected to the best writer.

22 Claims, 11 Drawing Sheets

(56) References Cited

U.S. PATENT DOCUMENTS

| | | |
|---|---|---|
| 8,810,764 B2 | 8/2014 | Nishida et al. |
| 8,828,248 B2 | 9/2014 | Mao et al. |
| 8,836,059 B2 | 9/2014 | Ahn et al. |
| 9,171,561 B1 | 10/2015 | Gadbois et al. |
| 9,387,568 B1 | 7/2016 | Ilaw et al. |
| 9,613,642 B1 | 4/2017 | Erden et al. |
| 9,754,612 B2 | 9/2017 | Wei et al. |
| 9,805,744 B1 | 10/2017 | Xue et al. |
| 2006/0145721 A1 | 7/2006 | Ton-Churo |
| 2010/0007986 A1 | 1/2010 | Mak et al. |
| 2016/0111118 A1* | 4/2016 | Funayama ........... G11B 5/4853 360/234.3 |
| 2016/0254014 A1 | 9/2016 | Biskeborn et al. |
| 2017/0256275 A1 | 9/2017 | Hutchinson et al. |

OTHER PUBLICATIONS

Co-pending U.S. Appl. No. 15/912,821, filed Mar. 6, 2018, by Yuhui Tang et al., "Designs for Multiple Perpendicular Magnetic Recording (PMR) Writers and Related Head Gimbal Assembly (HGA) Process," 49 pgs.

Co-pending U.S. Appl. No. 15/913,167, filed Mar. 6, 2018, by Yue Liu, "Dual Perpendicular Magnetic Recording (PMR) Writer Base Structures and Mirror Imaged Asymmetrical Magnetic Core Shapes for Reduced Writer-Writer Spacing (WWS)," 52 pgs.

Co-pending U.S. Appl. No. 15/966,192, filed Apr. 30, 2018, by Yue Liu et al., "Coil Routing Designs for Dual and Triple Perpendicular Magnetic Recording (PMR) Writers," 72 pgs.

* cited by examiner

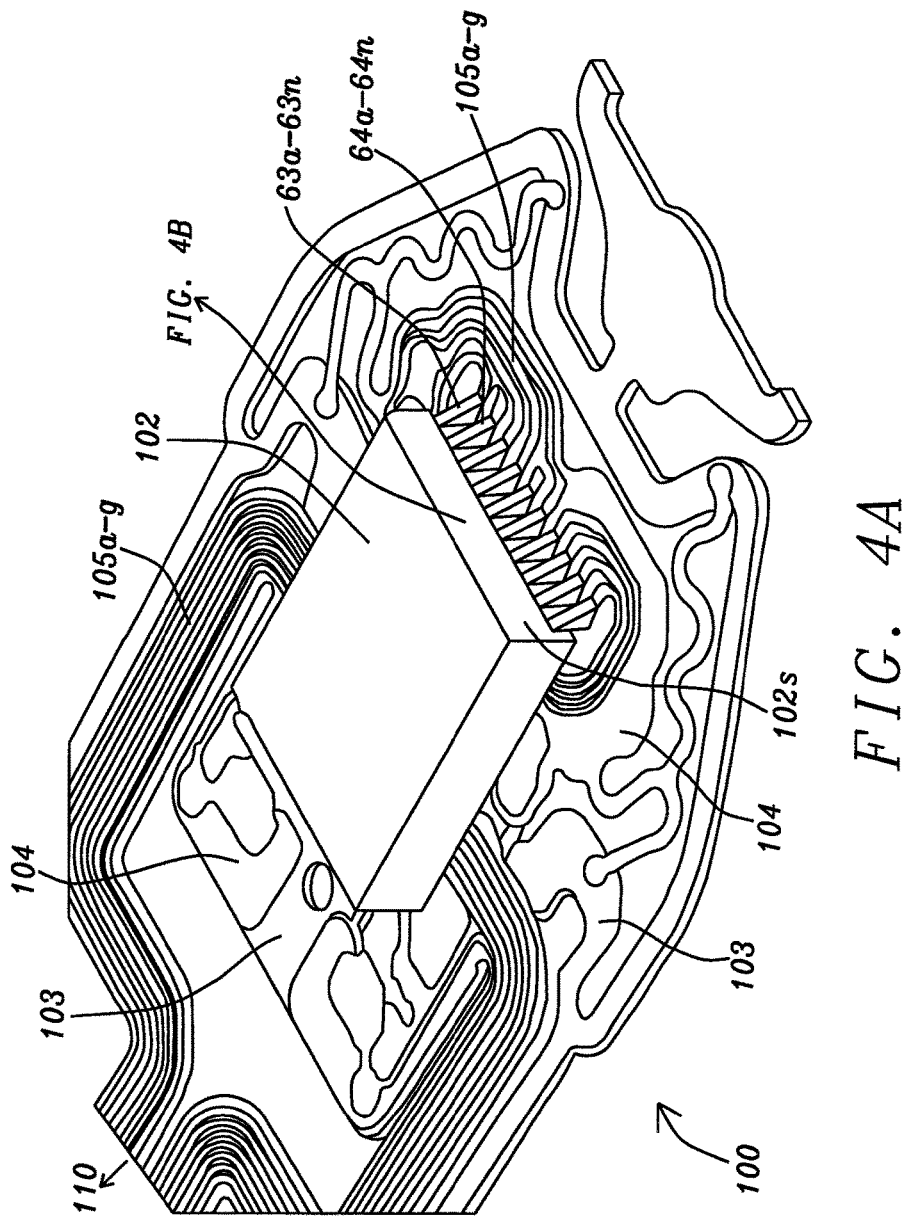

DESIGNS FOR MULTIPLE PERPENDICULAR MAGNETIC RECORDING (PMR) WRITERS AND RELATED HEAD GIMBAL ASSEMBLY (HGA) PROCESS

RELATED PATENT APPLICATIONS

This application is related to the following: Ser. No. 15/942,640, filing date Apr. 2, 2018; and, Ser. No. 15/966,192, filing date Apr. 30, 2018; which are assigned to a common assignee and herein incorporated by reference in their entirety.

TECHNICAL FIELD

The present disclosure relates to a magnetic recording apparatus including multiple PMR write heads (writers) formed on a slider, and the layout of multiple pads and trace lines to connect the writers to a preamp after the best writer is determined by spin stand testing, and the slider is mounted on a suspension in a HGA, and to a process that enables the best writer to be selected for seamless integration into a HGA in a hard disk drive (HDD).

BACKGROUND

Perpendicular magnetic recording has been developed in part to achieve higher recording density than is realized with longitudinal recording devices. A PMR write head typically has a main pole layer with a small surface area at an air bearing surface (ABS), and coils that conduct a current and generate a magnetic flux in the main pole such that the magnetic flux exits through a write pole tip and enters a magnetic medium (disk) adjacent to the ABS. Magnetic flux is used to write a selected number of bits in the magnetic medium and typically returns to the main pole through two pathways including a trailing loop comprised of a trailing shield structure, and a leading loop comprised of a leading shield and back gap connection. The double write shield (DWS) design that features the leading and trailing loops was invented for adjacent track erasure (ATE) improvement by reducing stray field in side shields and in the leading shield. A PMR writer has a great advantage over longitudinal magnetic recording (LMR) in providing higher write field, better read back signal, and potentially much higher areal density.

Perpendicular magnetic recording has become the mainstream technology for disk drive applications beyond 150 Gbit/in$^2$. With the growing demand for cloud storage and cloud-based network computing, high and ultra high data rate recording becomes important for high-end disk drive applications. Thus, it is essential to design a PMR writer that can achieve high area density capability (ADC) in addition to improved stray field robustness characterized by low ATE and a bit error rate (BER) of about $10^{-6}$ or less.

In today's PMR heads, the critical dimensions (CDs) of the PMR writer such as the track width (TW) are within a 10 nm to 100 nm range. However, the capabilities of process tools and variations in writer CDs have not been keeping up with the reductions in CDs. As a result, there are typically large fluctuations in writer performance, which impact both HGA yield and subsequent HDD yield. Thus, there is a need for an improved PMR writer design that minimizes variations in writer performance, and a means of integrating the design that comprises multiple writer pads with a plurality of trace lines which form electrical connections from a preamp in the HGA to the writer structure on a slider.

SUMMARY

One objective of the present disclosure is to provide a PMR writer structure having a plurality of writers on a slider wherein ADC mean and sigma is improved for the better or best writer compared with a single writer configuration, and to provide a layout for writer pads that enable spin stand testing to individually probe each of the plurality of writers.

A second objective of the present disclosure is to provide a procedure for testing the PMR writer structure of the first objective wherein a spin stand test device has capability to sequentially test two or more PMR writers per slider, and determine which writer has the best performance.

Another objective of the present disclosure is to provide a scheme that allows flexibility in connecting the writer pads for the best writer according to the first and second objectives with trace lines from a preamp in the HGA.

These objectives are achieved by configuring a PMR writer with two or more writers per slider so that the better (or best) writer may be selected during backend slider performance testing, and before integrating the slider into a HGA and Head-Stack Assembly (HSA) for state of the art HDDs. There is a plurality of pads on the slider that control current supply to coils which generate magnetic flux in the main pole of a selected writer, and that are connected through two traces lines to a preamp after spin stand testing. According to one embodiment where there are two writers per slider, spin stand testing is used to determine magnetic performance in the first writer by injecting a current through a W1+ pad to a first driving coil, and through an interconnect to a first bucking coil before exiting the first writer to a W1− pad. Accordingly, magnetic flux is generated in the first writer and measurements including ADC results are obtained. Thereafter, the second writer is tested with a similar process where a write current is injected through a W2+ pad to a second driving coil, and through an interconnect to a second bucking coil before exiting the second writer at a W2− pad. Magnetic flux is thereby produced in the second writer and measurements such as ADC results are taken. In embodiments with a plurality of "n" writers per slider, each of the writers is probed with a process similar to that used for testing the first and second writers to generate performance results. In some embodiments, a common W− pad may replace the W1− pad and W2− pad, and optionally a Wn− pad, if there are more than two writers on the slider.

A key feature is fork-like arms on an end portion of first and second trace lines from a preamp where a first arm on the first trace line is connected to one of the W1+ and W2+ pads, or optionally, to a Wn+ pad depending on whether the first writer, second writer, or nth writer, respectively, is determined to have the best write performance from spin stand testing. In one embodiment, an end portion of the second trace line also comprises a plurality of fork-like arms that enable flexibility in connecting to the W1− pad, or to the W2− pad, or to the Wn− pad when the first writer, or second writer, or nth writer, respectively, has the best performance. In particular, a second arm on the second trace line is connected to a W− pad (W1−, W2−, or Wn−) for the selected (best) writer. For example, if the first writer has the best performance, the first writer becomes functional with an electrical connection from the preamp through the first trace line, first arm, W1+ pad, and first writer to activate a main pole therein, and returns to the preamp through the W1− pad, second arm, and second trace line.

In an alternative embodiment, the second trace line is joined to a common W-pad that is connected to each of the "n" writers. Thus, if the second writer is the best writer, the first arm in the first trace line is connected to the W2+ pad after mounting the slider on a suspension in the HGA. The main pole in the second writer is energized with a current from the preamp through the first trace line, first arm, and through a bucking coil and driving coil in the second writer, and returns to the preamp through the W− pad. In all embodiments, only the best writer becomes functional in the HGA while the other writers are disabled because of an open circuit in the form of a gap between other arms in the first trace line and the W+ pads for the unselected writers.

BRIEF DESCRIPTION OF THE DRAWINGS

FIG. 4A is an oblique view of a head gimbal assembly (HGA) on which a slider is mounted, and depicts pads on a slider side, and trace lines formed on a suspension according to an embodiment of the present disclosure.

DETAILED DESCRIPTION

The present disclosure relates to a PMR writer structure wherein a plurality of writers is formed on a slider and each writer has a unique circuit including bucking/driving coils and at least one independent pad that allow a write current from a spin stand tester to be routed through the circuit to generate magnetic flux in a main pole of the selected writer and thereby determine magnetic performance. After each writer is tested, the writer having the best performance is selectively integrated into a HGA assembly through a connection from a preamp through a first trace line to a W+ writer pad and through a second connection from a second trace line to a W− writer pad. At least one writer pad for each of the unselected writers is not connected to the preamp to leave an open circuit for those writers. The first and second trace lines have fork like ends that allow a connection to the selected two writer pads. Dimensions of writer components are expressed as a width in the cross-track (y-axis) direction, height in the x-axis direction that is orthogonal to the ABS, and thickness in the down-track (z-axis) direction. The pad and trace line layout disclosed herein as well as the process for determining the best writer on a slider is not limited to a particular base writer structure, coil design, or magnetic core scheme including those described in related patent applications. Moreover, there may be one or more readers (read heads) on the slider having a plurality of writers. The terms energize and activate may be used interchangeably when referring to generating magnetic flux in a main pole of a selected writer.

In related patent application docket number HT17-030, we disclosed a dual PMR writer with a magnetic core/coil design that enables a write current to be selectively directed through a first circuit to energize the first writer, or through a second circuit to activate the second writer for performance testing. Subsequently, the first circuit is open (not connected to preamp) if the second writer is the better writer, or the second circuit is open if the first writer is the better writer. Thus, only the better writer is functional when integrated into a HGA.

In related patent application docket number HT17-035, we further expanded on the dual PMR writer design to include three or more writers per slider, flexibility in the base writer structure, and with either a pancake or helical coil design to selectively energize one of the writers. In the present disclosure, we describe a pad layout featuring at least one independent pad that connects with a bucking coil or driving coil in each of a plurality of writers on a slider, and trace lines with fork-like arms that enable a write current to flow from a preamp to the appropriate set of pads for energizing a selected writer, and then return to the preamp.

Figure 1:
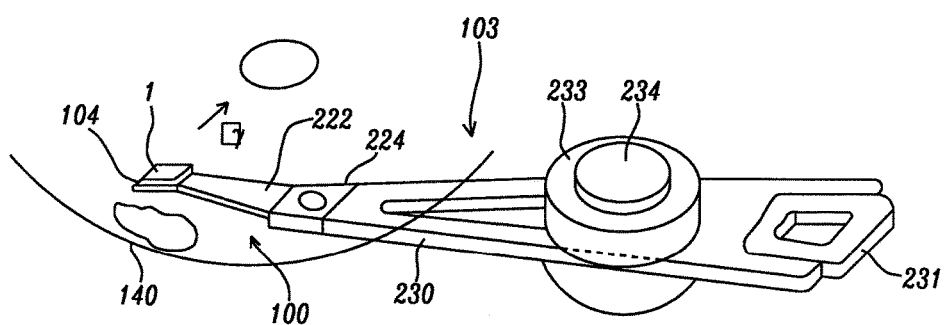
FIG. 1 is a perspective view of a head arm assembly of the present disclosure.

Referring to FIG. 1, a HGA 100 includes a magnetic recording head 1 comprised of a slider and a PMR writer structure formed thereon, and a suspension 103 that elastically supports the magnetic recording head. The suspension has a plate spring-like load beam 222 formed with stainless steel, a flexure 104 provided at one end portion of the load beam, and a base plate 224 provided at the other end portion of the load beam. The slider portion of the magnetic recording head is joined to the flexure, which gives an appropriate degree of freedom to the magnetic recording head. A gimbal part (not shown) for maintaining a posture of the magnetic recording head at a steady level is provided in a portion of the flexure to which the slider is mounted.

HGA 100 is mounted on an arm 230 formed in the head arm assembly 103. The arm moves the magnetic recording head 1 in the cross-track direction y of the magnetic recording medium 140. One end of the arm is mounted on base plate 224. A coil 231 that is a portion of a voice coil motor is mounted on the other end of the arm. A bearing part 233 is provided in the intermediate portion of arm 230. The arm is rotatably supported using a shaft 234 mounted to the bearing part 233. The arm 230 and the voice coil motor that drives the arm configure an actuator.

Figure 2:
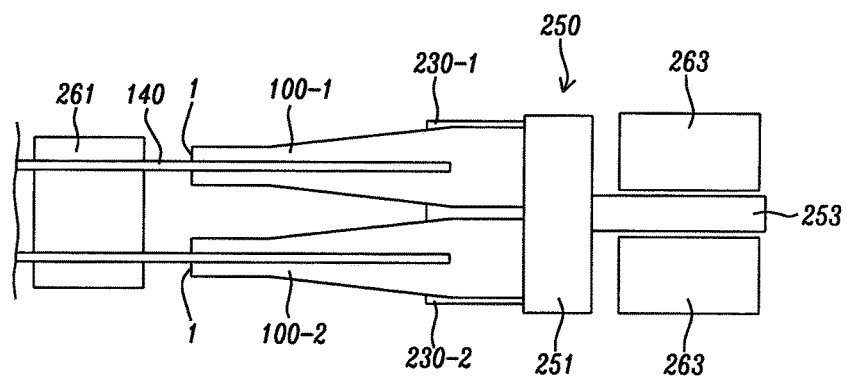
FIG. 2 is side view of a head stack assembly of the present disclosure.

Next, a side view of a head stack assembly (FIG. 2) and a plan view of a magnetic recording apparatus (FIG. 3) wherein the magnetic recording head 1 is incorporated are depicted. The head stack assembly 250 is a member to which a first HGA 100-1 and second HGA 100-2 are mounted to arms 230-1, 230-2, respectively, on carriage 251. A HGA is mounted on each arm at intervals so as to be aligned in the perpendicular direction (orthogonal to magnetic medium 140). The coil portion (231 in FIG. 1) of the voice coil motor is mounted at the opposite side of each arm in carriage 251. The voice coil motor has a permanent magnet 263 arranged at an opposite position across the coil 231.

Figure 3:
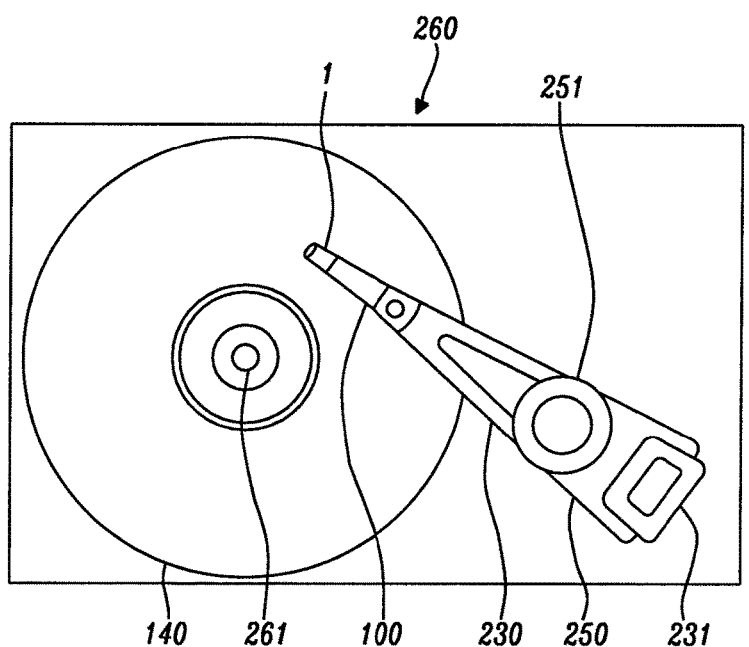
FIG. 3 is a plan view of a magnetic recording apparatus of the present disclosure.

With reference to FIG. 3, the head stack assembly 250 is incorporated in a magnetic recording apparatus 260. The magnetic recording apparatus has a plurality of magnetic media 140 mounted to spindle motor 261. For every magnetic recording medium, there are two magnetic recording heads arranged opposite one another across the magnetic recording medium. The head stack assembly and actuator except for the magnetic recording heads 1 correspond to a positioning device, and support the magnetic recording heads, and position the magnetic recording heads relative to the magnetic recording medium. The magnetic recording heads are moved in a cross-track of the magnetic recording medium by the actuator. The magnetic recording head records information into the magnetic recording media with a PMR writer element (not shown) and reproduces the information recorded in the magnetic recording media by a magnetoresistive (MR) sensor element (not shown).

Referring to FIG. 4A, HGA 100 is depicted and features suspension 103 that supports an overlying flexure 104 made of a dielectric material, and a slider 102 formed thereon. A combined read/write head comprised of the PMR writer structure of the present disclosure adjoins a front side of the slider 102s. In the exemplary embodiment, two or more writers (not shown) are formed on the slider and each writer has independent pads attached to slider side 102s. There is a plurality of W+ pads represented by W1+ pad 63a, W2+ pad 63b, and so forth up to Wn+ pad 63n but only one of the W+ pads is electrically connected to the preamp 110 through trace line 105 that is formed on the flexure. Likewise, according to one embodiment, there is a plurality of W− pads represented by W1− pad 64a, W2− pad 64b, and so forth up to Wn− pad 64n, but only one of the W-pads is electrically connected to the preamp through trace line 105a also formed on the flexure. In another embodiment, W− pads 64a-64n may be replaced with a common W− pad 64 as described in a later section. Additional trace lines 105c-g are used to connect other functionality in the PMR writer to the preamp as explained in the description of FIGS. 5A-5B. Connections between the pads and the combined read/write head are within the slider and not visible from this view. The W1+/W1− pads that complete a first circuit (not shown) to energize a main pole in the first writer are connected (W2+/W2− pads and Wn+/Wn− pads are not connected) to the preamp when the first writer is found to have the better performance. If the second writer has better performance, then the W2+/W2− pads that complete a second circuit to energize a main pole in the second writer are connected to the preamp while the W1+/W1− pads and Wn+/Wn− pads are not connected so that only the preferred writer is functional in the HGA.

Figure 4B:
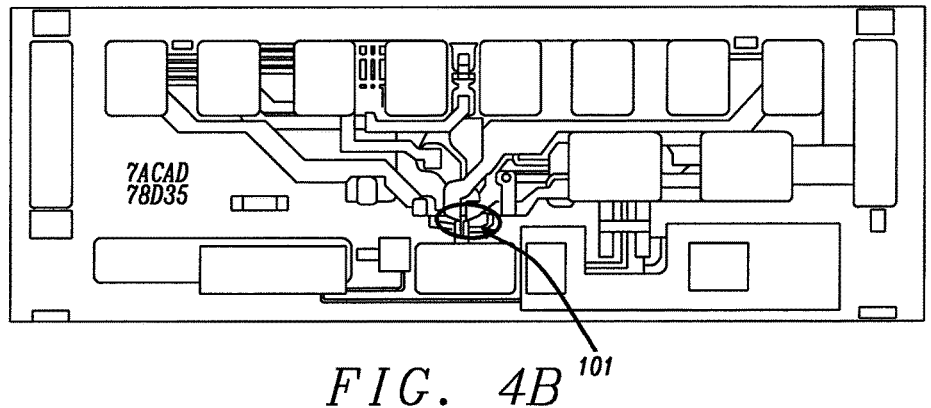
FIG. 4B depicts a side of the slider on which a PMR writer structure is formed according to an embodiment of the present disclosure.

Referring to FIG. 4B, slider side 102s is enlarged from FIG. 4A to show the PMR writer structure 101 in the write head portion of the combined read/write head. Note that the MR sensor (reader) in the read head portion is located behind the PMR writer structure and is not visible in this view.

Figure 5A:
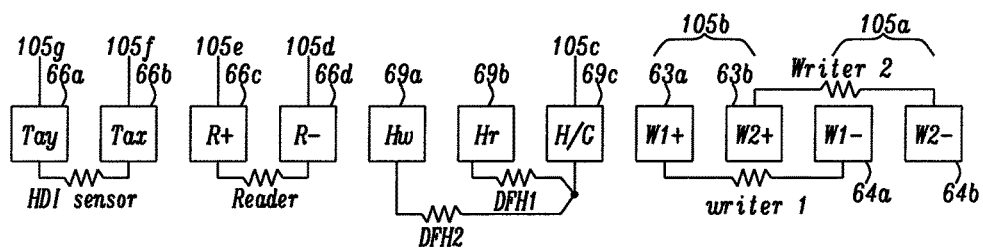
FIG. 5A is diagram showing one possible configuration for the plurality of pads on the slider in FIG. 4A for an embodiment where two PMR writers are formed per slider.

In FIG. 5A, one embodiment of the pad layout is shown for a combined read/write head having two PMR writers on a slider according to first embodiment of the present disclosure. Pads interface the writers, reader, two DFH heaters, and contact (HDI) sensors in the combined read/write head to the driving circuits through the trace lines in the HGA described previously. Pads 66a-66b control the contact sensor function and are connected to the preamp 110 in FIG. 4A through trace lines 105g, 105f, respectively. Meanwhile, pads 66c-66d control the reader function and are connected to the preamp through trace lines 105e, 105d, respectively. Pads 69a-69c are used to manage the two DFH heaters through trace line 105c. If writer 1 is selected as the better writer, pad 63a is attached to trace line 105b while pad 64a is attached to trace line 105a. When writer 2 is determined to be the better writer, pad 63b is attached to trace line 105b and pad 64b is connected to trace line 105a. Accordingly, the total number of functional pads is nine when a dual independent DFH heater mode is employed as in FIG. 5A. Alternatively, there may be a parallel DFH heater mode (not shown) where the total number of functional pads is only 8.

Figure 5B:
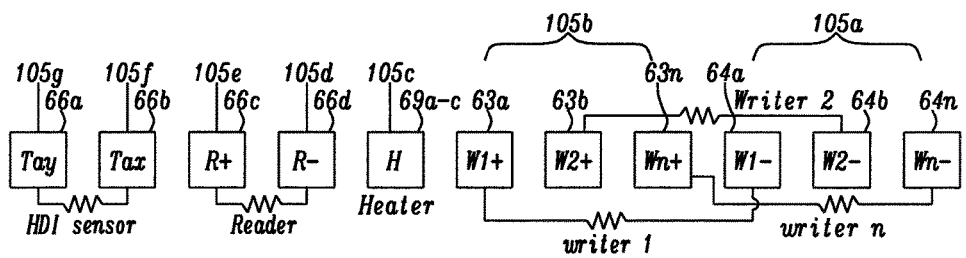
FIG. 5B is a diagram showing another pad configuration on a slider having a plurality of n writers.

In FIG. 5B, the pad layout is modified to include a Wn+ pad 63n, and a Wn− pad 64n for a PMR writer structure with n writers on a slider. Only one of the plurality of W+ pads 63a up to 63n, and one of the plurality of W− pads 64a up to 64n is connected to trace lines 105b, 105a, respectively, depending on which writer is selected as the best writer. Here, pads 69a-69c are three pads enabling heater functionality in FIG. 5A. The total number of trace lines remains the same since only two trace lines are required to activate the selected writer in a HGA.

Figure 6A:
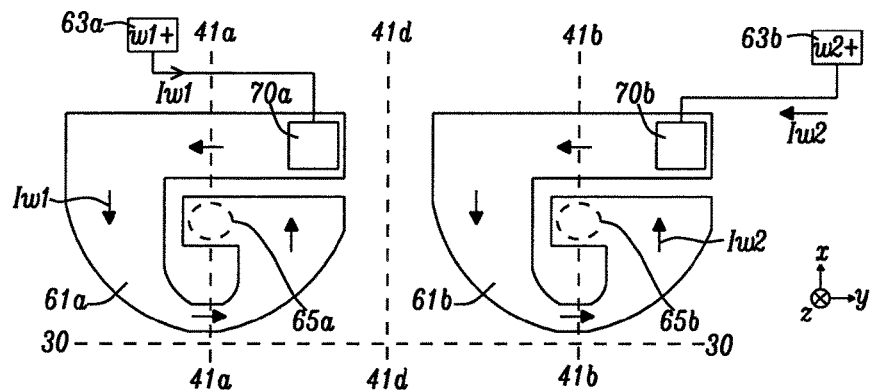
FIG. 6A is a top-down view of a dual writer structure that shows one possible configuration for a driving coil layout and writer pads to input a write current according to an embodiment of the present disclosure.

In FIG. 6A, one embodiment of a driving coil design in a dual PMR writer is shown from a top-down view and is part of a 1+1T coil configuration wherein first and second driving coils have front sides 61/1, 61/2, respectively, recessed from the ABS 30-30. A pancake coil shape is depicted. However, other coil shapes such as a helical shape as disclosed in related application HT17-035 are also acceptable. The first driving coil 61a is in a first writer (writer 1) and a second driving coil 61b is in a second writer (writer 2) that are formed on opposite sides of a center plane 41d-41d separating the first and second writers. Plane 41a-41a bisects a first main pole (not shown) in writer 1 and is aligned orthogonal to the ABS while plane 41b-41b bisects a second main pole (not shown) in writer 2 and is also orthogonal to the ABS. W1+ pad 63a is connected to driving coil 61a at contact 70a, and W2+ pad 63b is connected to driving coil 61b at contact 70b. The first driving coil has an inner portion that contacts a top surface of interconnect (center tap) 65a that is proximate to plane 41a-41a. Moreover, the second driving coil has an inner portion that contacts a top surface of interconnect 65b that is proximate to plane 41b-41b.

Figure 6B:
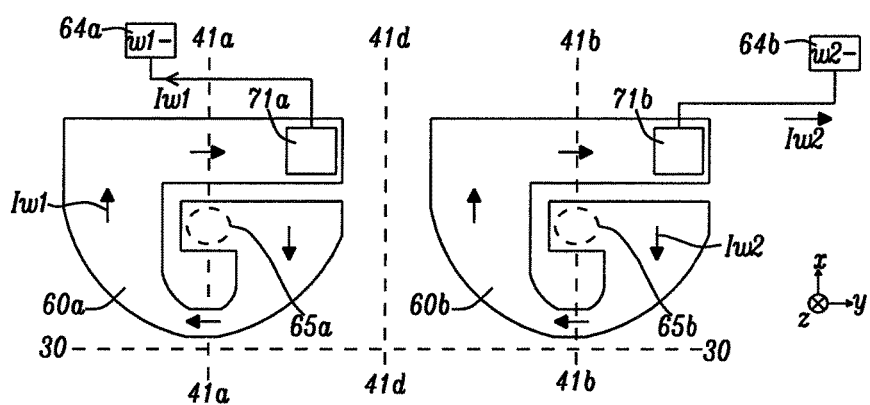
FIG. 6B is a top-down view of a bucking coil layout with writer pads that is compatible with the driving coil design in FIG. 6A.

FIG. 6B shows one embodiment of a bucking coil layout that is compatible with the driving coil design in FIG. 6A. First and second bucking coils have front side 60f1, 60f2, respectively, recessed from the ABS 30-30. The first bucking coil 60a is in writer 1 and second driving coil 60b is in writer 2, and are configured below driving coils 61a, 61b, respectively. W1− pad 64a is connected to bucking coil 60a at contact 71a, and W2− pad 64b is connected to bucking coil 60b at contact 71b. The first bucking coil has an inner portion that contacts a bottom surface of interconnect 65a so that write current Iw1 may be introduced at W1+ pad 63a in the first driving coil and proceed through interconnect 65a to first bucking coil 60a and finally exit the coils to W1− pad 64a. Also, the second bucking coil has an inner portion that contacts a bottom surface of interconnect 65b so that write current Iw2 may be introduced at W2+ pad 63b in the second driving coil and proceed through interconnect 65b to second bucking coil 60b and finally exit the coils to W2− pad 64b.

Figure 7:
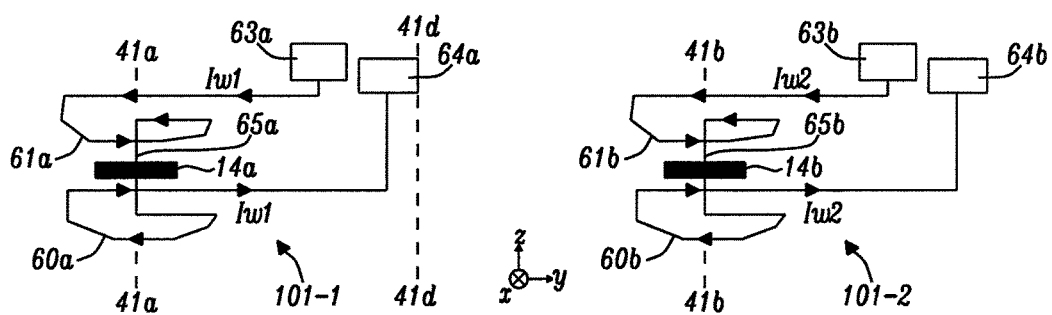
FIG. 7 is a schematic drawing of the coil layouts in FIGS. 6A-6B that also shows first and second writers each having main poles between a driving coil and bucking coil according to an embodiment of the present disclosure.

Referring to FIG. 7, a schematic drawing is provided of a dual PMR writer where writer 1 and writer 2 are formed on opposite sides of a center plane 41d-41d according to one embodiment of the present disclosure. Writer 1 has a first main pole (MP1) 14a that is energized to generate magnetic flux by conducting a write current 1w1 through first driving coil 61a, interconnect 65a formed behind MP1, and first bucking coil 60a. Similarly, writer 2 has a second main pole (MP2) 14b that is energized by passing a write current Iw2 through second driving coil 61b, interconnect 65b behind MP2, and second driving coil 60b. Thus, the magnetic performance of writer 1 and writer 2 may be determined by injecting write current Iw1 at W1+ pad 63a and injecting write current Iw2 at W2+ pad 63b, respectively. The first circuit used to energize writer 1 also includes W1− pad 64a, and the second circuit employed to energize writer 2 also includes W2− pad 64b.

A key feature of the present disclosure is that the writers in a dual or triple PMR write structure on a slider are probed with a commercially available spin stand test device to determine the writer with the better (or best) magnetic performance before the slider is paired with a suspension and integrated in a HGA. A specially designed cartridge is attached to the spin stand test device to enable selective probing of one writer on a slider having a plurality of writers. Details relating to the cartridge and method of incorporating in a commercial spin stand test device will be the subject of a subsequent patent application.

According to one embodiment of the present disclosure, the process of determining the better writer in a dual PMR write structure or the best writer in a multiple PMR write structure with n writers where n is an integer≥3 comprises sequentially probing writer 1, writer 2, and up to writer n to determine the magnetic performance in each writer. For example, first writer 101-1 in FIG. 7 may be probed during a first time period by injecting write current Iw1 at pad 63a that passes through driving coil 61a, interconnect 65a, and bucking coil 60a before exiting at pad 64a and thereby activating main pole 14a. Likewise, second writer 101-2 may be tested during a second time period by sending write current Iw2 through pad 63b, driving coil 61b, interconnect 65b, and bucking coil 60b before exiting at pad 64b to activate writer 101-2. Probing is defined as a procedure comprised of injecting a write current through a set of W+, W− pads to activate a selected writer, and measuring the magnetic output including but not limited to one or more of BER, squeeze BER, and ADC. Generally, the writer that produces the best ADC results is selected as the writer to be integrated into the HGA in the following step.

Figure 8A:
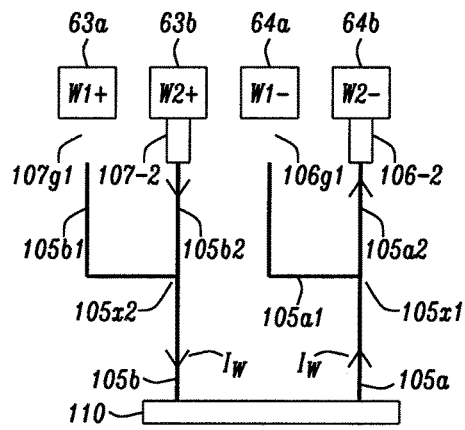
FIGS. 8A-8B are schematic drawings for trace lines, writer pads, and a preamp when the better writer in a dual PMR writer is the second writer and first writer, respectively, and is integrated in a HGA according to an embodiment of the present disclosure.

Referring to FIG. 8A, a pad/trace line layout is depicted according to an embodiment of the present disclosure where the second writer in a dual PMR writer structure was found to have the better performance during spin stand testing. It should be understood that the slider has been mounted on a suspension in a HGA before connections are made between the selected writer and trace lines in final assembly. A key feature is first and second trace lines 105a, 105b, respectively, from preamp 110 each have ends comprised of fork-like arms. In particular, trace line 105a has a junction 105x1 where one arm 105a1 extends toward the W1− pad 63b but is separated therefrom by gap 106g1, and a second arm 105a2 is connected with the W2− pad 64b with a solder joint 106-2. Meanwhile, trace line 105b has a junction 105x2 where one arm 105b1 extends towards W1+ pad 63a but is separated therefrom by gap 107g1, and a second arm 105b2 is connected to W2+ pad 63b with solder joint 107-2. Accordingly, the connections between arms 105a2, 105b2 enable a write current Iw to flow through the second writer when the write gate in the preamp is switched to "ON". There is an open circuit comprised of gaps 106g1, 107g1 to prevent the first writer from being activated in the HGA.

The process flow required to fabricate a dual PMR writer has variability such that critical dimensions including main pole thickness and track width may be unequal in the first and second writers thereby influencing performance output in terms of ADC, for example. In actual practice, there is a 50% probability that the first writer is the better of the two writers, and a 50% probability that the second writer is the better of the two writers. The fork-like arms disclosed herein provide flexibility in back end processing to enable only the better writer to be functional in the HGA.

Figure 8B:
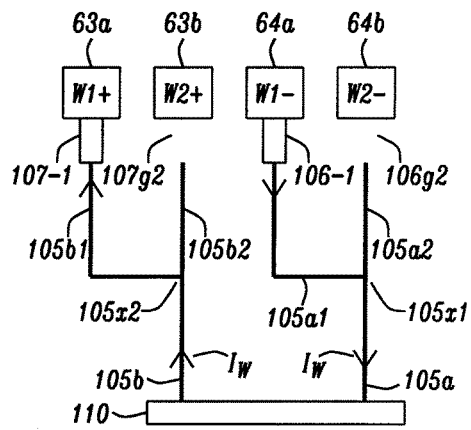

Referring to FIG. 8B, an alternative embodiment of the previously described pad/trace line layout is depicted where the first writer in a dual PMR writer structure is found to be the better writer during spin stand testing. Accordingly, only arm 105b1 from junction 105x2 in trace line 105b is connected with a solder joint 107-1 to pad 63a, and only arm 105a1 from junction 105x1 in trace line 105a is connected with a solder joint 106-1 to W1− pad 64b. Meanwhile, there is a gap 107g2 between fork-like arm 105a2 and W2+ pad 63b, and a gap 106g2 between fork-like arm 105b2 and W2− pad 64b to prevent the second writer from being activated. Thus, only the first writer is functional in the HGA because the connections between arms 105a1, 105b1 and the W1+, W1− pads enable a write current Iw to flow through the first writer when the write gate is switched to "ON".

Figure 9A:
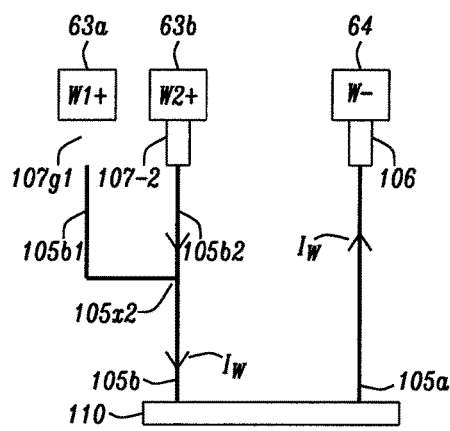
FIGS. 9A-9B are schematic drawings for trace lines, writer pads, and a preamp when the better writer in a dual PMR writer is the second writer and first writer, respectively, and is integrated in a HGA, and the writers have a common W− pad according to an embodiment described herein.

Referring to FIG. 9A, the present disclosure also encompasses an embodiment where the two writers in a dual PMR writer structure share a common pad, which is the W− pad 64 in the exemplary embodiment. Note that the common W− pad replaces the W1− and W2− pads in the previously described embodiments. FIG. 9A shows a pad/trace line layout in the HGA as a result of the second writer having the best performance during spin stand testing of a dual PMR writer structure. Note that a portion of the first embodiment in FIG. 8A is retained where the second trace line 105b has a fork-like arm 105b2 connected to W2+ pad 63b through solder joint 107-2 while there is a gap 107g1 between arm 105b1 and W1+ pad 63a. Since there is a common W− pad, there is no need for fork-like branches 105a1, 105a2 or junction 105x1 on trace line 105a proximate to the writer pads. Instead, trace line 105a extends to the W− pad 64 and is connected thereto with solder joint 106. As a result, write current Iw may be sent from preamp 110 through trace line 105a to the W− pad 64, through the second writer (not shown), and returns to the preamp through W2+ pad 63b and trace line 105b thereby enabling functionality only in the second writer in the HGA.

Figure 9B:
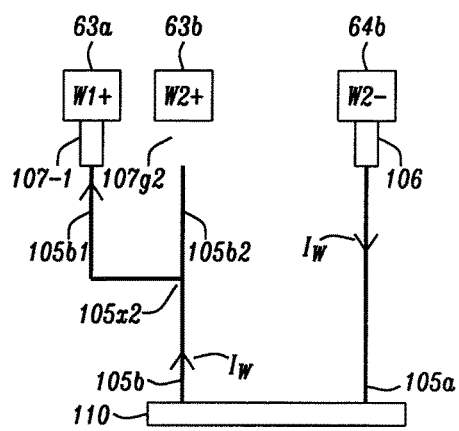

FIG. 9B depicts a pad/trace line layout for an embodiment wherein the first writer in a dual PMR writer structure has better performance during spin stand testing, and where the writers share a common W− pad 64 to replace the independent W1− and W2− pads in FIG. 8B. As in FIG. 9A, fork-like branches 105a1, 105a2, and junction 105x1 are omitted so that trace line 105a extends from the preamp 110 to the W− pad 64 and is connected thereto by solder joint 106. Here, fork-like arm 105b1 is connected to W1+ pad 63a while there is a gap 107g2 between arm 105b2 and W2+ pad 63b so that there is no connection from W2+ pad 63b to arm 105b2 and trace line 105b. Accordingly, write current Iw may be sent from preamp 110 through trace line 105b to writer pad 63a, through the first writer (not shown), and returns to the preamp through common W− pad 64 and trace line 105b thereby enabling functionality only in the first writer in the HGA. In all of the embodiments shown in FIGS. 8A-9B, write current may be sent through trace line 105a and return to the preamp through trace line 105b, or vice versa.

Figure 10:
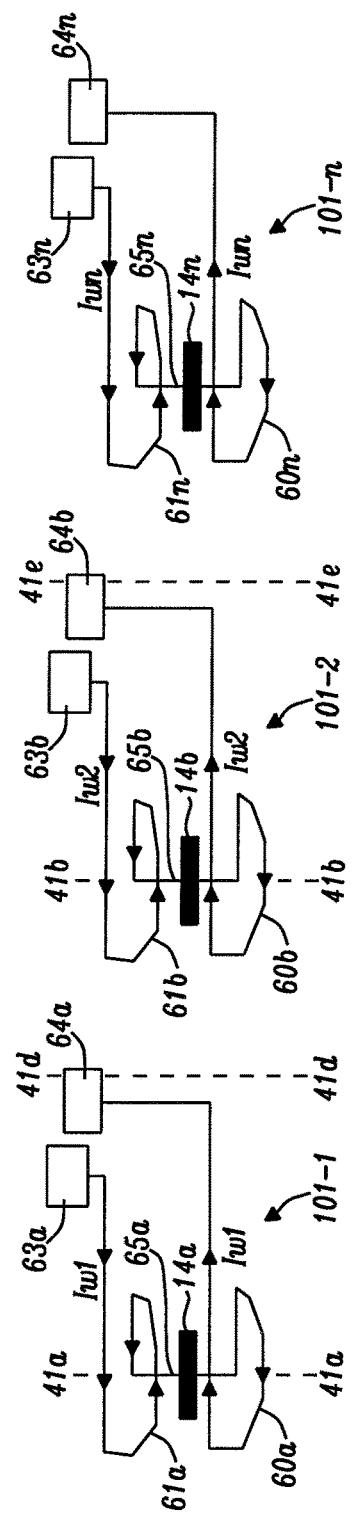
FIG. 10 is a schematic drawing showing three writers on a slider each having a main pole formed between a driving coil and a bucking coil according to an embodiment of the present disclosure.

Referring to FIG. 10, the present disclosure also anticipates a PMR writer structure comprising a plurality of "n" writers on a slider where n is an integer≥3. In the exemplary embodiment, the first writer 101-1 and second writer 101-2 are retained from FIG. 7, and there is at least an nth writer 101-n having a main pole MPn 14n that is formed on an opposite side of plane 41e-41e with respect to MP2 14b in the second writer. The nth writer may be probed during spin stand testing by injecting a write current Iwn at Wn+ pad 63n and that passes through driving coil 61n, interconnect 65n, bucking coil 60n, and exits at Wn− pad 64n.

Figure 11A:
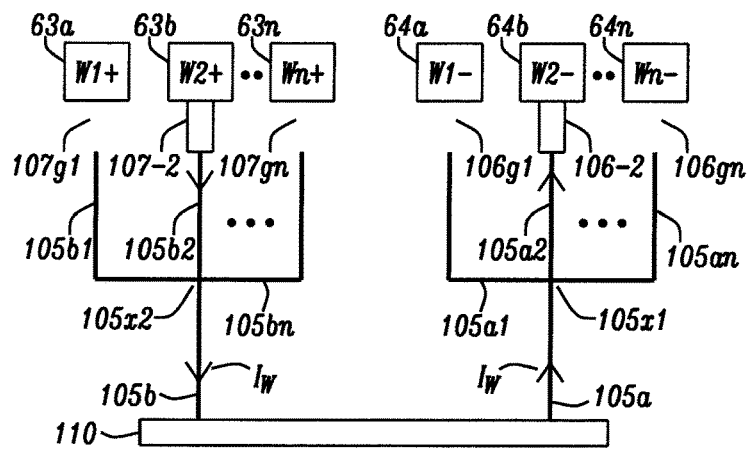
FIGS. 11A-11C are schematic drawings for trace lines, writer pads, and a preamp, when the best writer in a multiple writer is the second writer, nth writer, and first writer, respectively, and is integrated in a HGA according to an embodiment of the present disclosure.

In FIG. 11A, a pad/trace line layout in a HGA according to an embodiment of the present disclosure is shown where the second writer is the best writer among the "n" writers according to spin stand test results, and only the second writer is functional in the HGA. The pad/trace line design from FIG. 8A is modified to include an additional fork-like arm 105an from junction 105x1 that extends toward Wn− pad 64n but is separated therefrom by gap 106gn. Also there is another fork-like arm 105bn that extends from junction 105x2 toward Wn+ pad 63n, but is separated therefrom by gap 107gn. Accordingly, the connections between arm 105a2 in trace line 105a, and arm 105b2 in trace line 105b to pads 64b, 63b, respectively, enable a write current Iw to flow through the second writer when the write gate in the preamp 110 is switched to "ON". There is an open circuit comprised of gaps 106g1, 107g1 to prevent the first writer from being activated, and another open circuit comprised of gaps 106gn, 107gn to disable the nth writer in the HGA.

When n=3, there is an equal probability (33% for each) that the first writer, second writer, or third (nth) writer will exhibit the best magnetic performance. In another embodiment where n=4, there is an equal probability (25% each) that the first writer, second writer, third writer, or fourth writer will have the best performance. As in the dual PMR writer embodiments, the fork-like arms at the ends of trace lines 105a, 105b provide flexibility in connecting the selected (best) writer to the preamp in a HGA while disabling other writers on the slider.

Figure 11B:
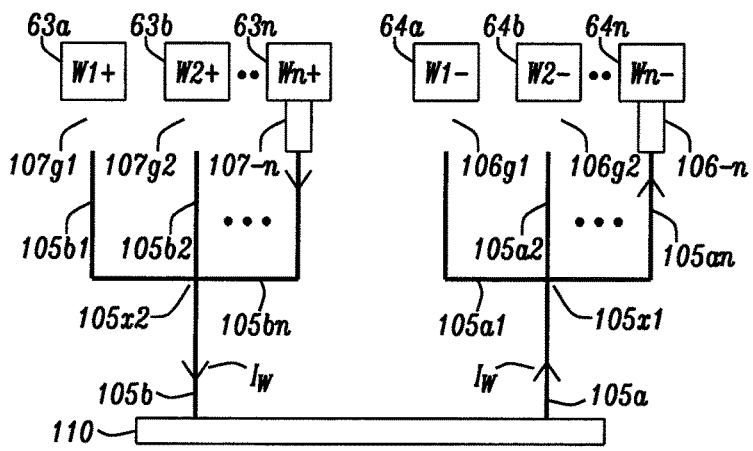

Referring to FIG. 11B, an alternative embodiment of the previously described pad/trace line layout for a PMR writer structure having n writers on a slider is depicted where the nth writer is found to be the better writer during spin stand testing. Accordingly, only arm 105bn from junction 105x2 in trace line 105b is connected with a solder joint 107-n to Wn+ pad 63n, and only arm 105an from junction 105x1 in trace line 105a is connected with a solder joint 106-n to Wn− pad 64n to enable functionality in the nth writer. Moreover, there is a gap 107g2 between arm 105a2 and W2+ pad 63b, and a gap 106g2 between arm 105b2 and W2− pad 64b to prevent the second writer from being activated. There is also a gap 107g1 between arm 105a1 and W1+ pad 63a, and a gap 106g1 between arm 105a1 and W1− pad 64a to prevent the first writer from being activated in the HGA. According to the exemplary embodiment, a write current 6 may flow from preamp 110 through trace line 105a to Wn− pad 64n, through the nth writer (not shown), and return to the preamp from Wn+ pad 63n and through trace line 105b.

Figure 11C:
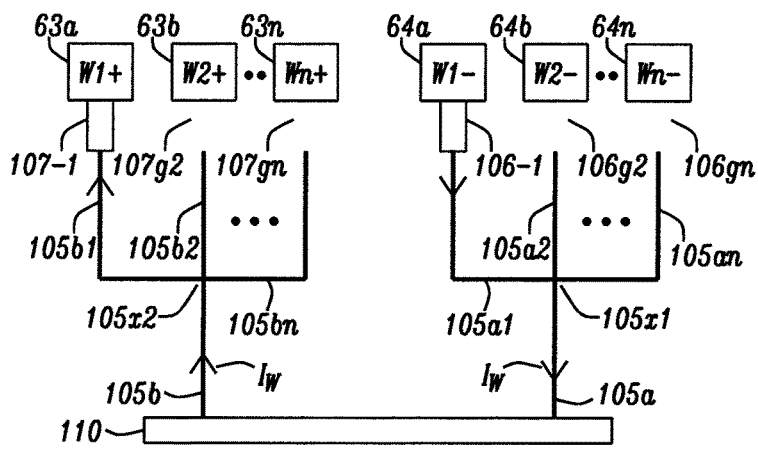

In FIG. 11C, the pad/trace line layout described in FIGS. 11A-11B is modified when the first writer in a PMR writer structure having n writers on a slider is found to have the best performance during spin stand testing. In this embodiment, arm 105b1 from junction 105x2 in trace line 105b is connected with a solder joint 107-1 to W1+ pad 63a, and arm 105a1 from junction 105x1 in trace line 105a is connected with a solder joint 106-1 to W1− pad 64a to enable functionality in the first writer. In addition, there is a gap 107g2 between arm 105a2 and W2+ pad 63b, and a gap 106g2 between arm 105b2 and W2− pad 64b to prevent the second writer from being activated. Another gap 107gn is formed between arm 105an and Wn+ pad 63n, and gap 106gn is between arm 105an and Wn− pad 64n to prevent the nth writer from being activated in the HGA. Thus, write current 6 may flow from preamp 110 through trace line 105b to W1+ pad 63a, through the first writer (not shown), and return to the preamp from W1− pad 64a and through trace line 105a. As in other embodiments, the direction of write current 1w may be reversed. Furthermore, all writers other than the nth writer have writer pads that are not connected to trace lines such that only the first writer is functional in the HGA.

Figure 12A:
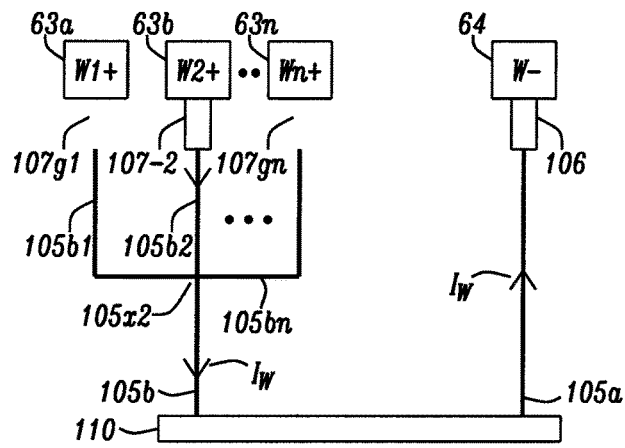
FIGS. 12A-12C are schematic drawings for trace lines, writer pads, and a preamp, when the best writer in a multiple writer is the second writer, nth writer, and first writer, respectively, and is integrated in a HGA, and the writers have a common W− pad according to an embodiment of the present disclosure.
Figure 12B:
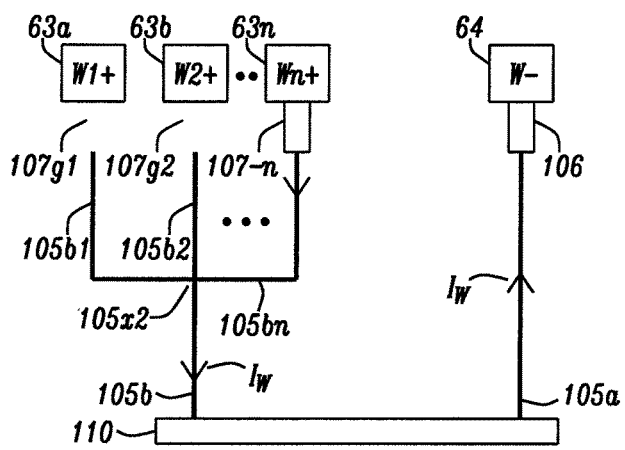
Figure 12C:
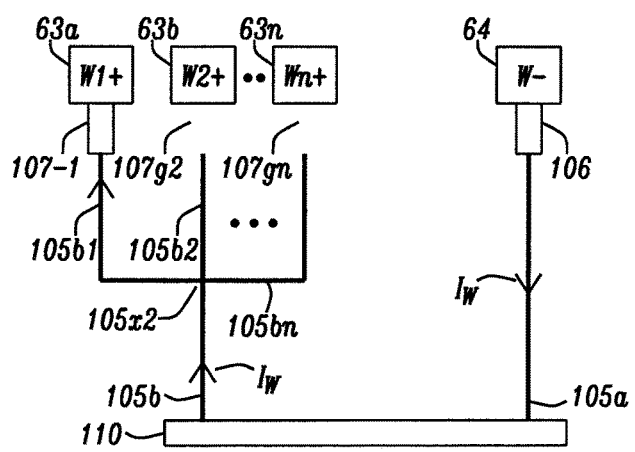

With regard to FIGS. 12A-12C, the trace line layout for "n" writers on a slider is modified from the designs in FIGS. 11A-11C, respectively, so that all writers share a common W− pad 64. In alternative embodiments, all writers may share a common W+ pad (not shown) while having separate W− pads such as W1− for writer 1, W2− for writer 2, and so forth up to Wn− for the nth writer. As a result, the number of pads on the slider (such as 102 in FIG. 4A) is minimized thereby requiring a smaller pad footprint in the cross-track direction.

According to one embodiment in FIG. 12A, the pad/trace line layout in FIG. 11A is modified with removal of the fork-like arms from first trace line 105a so that a permanent connection 106 is made between the first trace line and common W-pad 64. The connection 106 between arm 105a2 in trace line 105a to Wn− pad 64, and connection 107-2 between arm 105b2 in trace line 105b to W2+ pad 63b enable a write current Iw to flow through the second writer when the write gate in the preamp 110 is switched to "ON". There are open circuits comprised of gaps 107g1 and 107gn to prevent the first writer and nth writer, respectively, from being activated in the HGA.

Referring to FIG. 12B, the pad/trace line layout in FIG. 12A is retained except only Wn+ pad 63n is connected to trace line 105b through solder joint (connection) 107-n and arm 105bn when the nth writer has the best performance during spin stand testing. Meanwhile, there is a gap 107g2 between W2+ pad 63b and arm 105b2 to disable the second writer, and a gap 107g1 between W1+ pad 63a and arm 105b1 to disable the first writer. In summary, all writers except the nth writer have an open circuit to the preamp because of a gap between a W+ writer pad and trace line 105b. Thus, only the nth writer is functional in the HGA because write current Iw is able to flow through the nth writer as a result of connections between pads 63n, 64 to trace lines 105b and 105a, respectively.

With regard to FIG. 12C, an embodiment of the present disclosure is shown where the pad/trace line layout for "n" writers on a slider is modified so that only the first writer is functional when the first writer has the best performance during spin stand testing. W1+ pad 63a is connected to trace line 105b through solder joint (connection) 107-1 and arm 105b1 and Wn– pad is connected to trace line 105a thereby enabling a write current Iw to energize the first writer in the HGA. There is a gap 107g2 between W2+ pad 63b and arm 105b2 to disable the second writer, and a gap 107gn between Wn+ pad 63n and arm 105bn to disable the nth writer.

Figure 13:
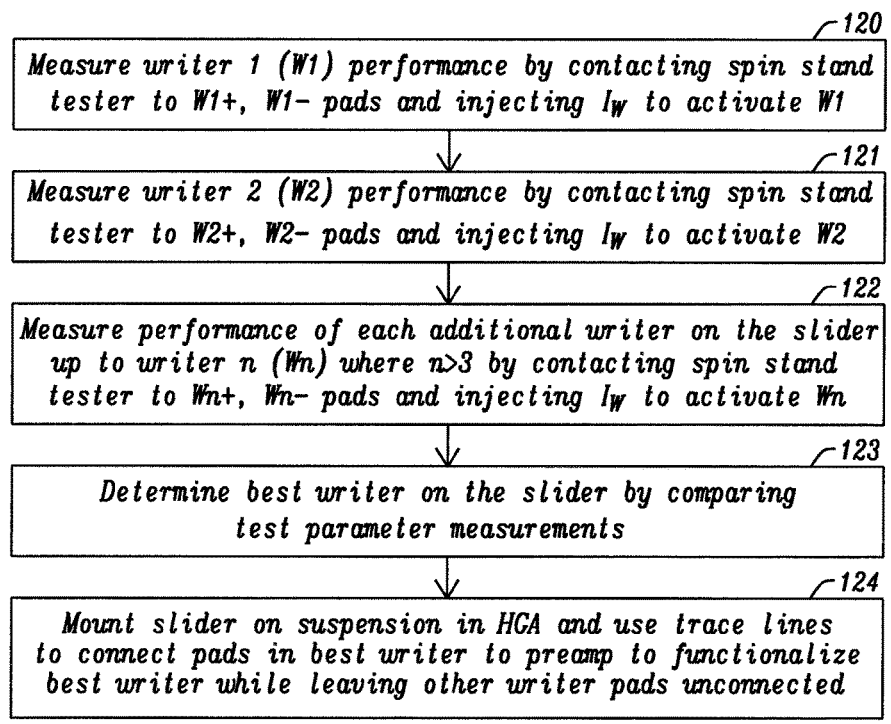
FIG. 13 is a flow diagram that depicts a series of steps used to select the best writer for a PMR writer design having a plurality of writers per slider where each writer has independent pads according to an embodiment described herein.

The present disclosure also encompasses a spin stand testing process that is utilized to determine the better writer in a dual PMR scheme, or the best writer in a PMR writer structure comprising a plurality of "n" writers on a slider. According to one embodiment shown in FIG. 13, the best writer on a slider is identified with a process flow comprised of steps 120-124. In step 120, the spin stand test device that is modified with a cartridge to enable selective probing of individual writers on a slider is used to determine the performance of the first writer by injecting a write current at W1+ pad 63a that passes through coils 60a, 61a to energize MP1 14a in the first writer, and exits through W1– pad 64a as shown in FIG. 10. Measurements are taken for ADC and in some embodiments for one or more additional parameters including but not limited to BER, and squeeze BER.

Thereafter, in step 121, spin stand testing is employed to measure the performance of the second writer 101-2 by injecting a write current at W2+ pad 63b that flows through coils 60b, 61b to energize MP2 14b in the second writer and exits through W2– pad 64b. Similar to step 120, ADC measurements are taken, and one or more results relating to BER and squeeze BER are obtained.

In embodiments where the PMR writer structure has n writers per slider where n≥3, step 122 is performed for each of the writers other than writer 1 and writer 2. Each of the other writers here designated as an nth writer 101-n is tested by injecting a write current at a Wn+ pad 63n that passes through coils 61n, 60n, and exits at Wn– pad 64n explained previously. Accordingly, the nth writer is energized and the spin stand testing device collects ADC measurements, as well as one or more of BER and squeeze BER data in some embodiments. In a dual PMR writer embodiment, step 122 is omitted.

In step 123, the better writer in a dual PMR writer structure or the best writer in a multiple writer scheme with ≥3 writers per slider is determined by comparing spinstand measurements from each of the writers. Preferably, the writer that generates the best ADC results is considered to be the best writer on the slider.

In step 124, the slider is mounted on a suspension in a HGA. Only the writer pads that enable functionality in the better (or best) writer are connected to trace lines from a preamp as explained earlier and shown in FIGS. 8A-8B for a dual writer or in FIGS. 11A-11C for n writers on a slider. All other writers have open circuits to the preamp because of at least one gap between a writer pad and a trace line.

The benefits of a dual PMR writer scheme according to the present disclosure are shown in Table 1 below. In particular, the mean ADC is improved by 2.4% and the sigma is tightened by 35.2% for a dual PMR writer compared with a single writer. Furthermore, in related patent application HT17-030, we disclosed how the overall footprint of the bucking coil and driving coil may be maintained in a dual PMR writer compared with a single writer. Accordingly, thermal-mechanical behavior is substantially the same as in state-of-the-art writers, and HDD applications in all mobile, near line, and high-end segments are maintained with essentially equal performance and reliability.

TABLE 1

Spinstand test results for a single writer with common reader, and for the better writer in a dual PMR writer with two writers per slider

|  | Single Writer 1 | Single Writer 2 | Best writer among writer 1 and 2 | Gain |
| --- | --- | --- | --- | --- |
| ADC mean (Gb/inch$^2$) | 870.6 | 870.6 | 891.6 | 2.4% |
| ADC sigma (Gb/inch$^2$) | 38.3 | 38.3 | 24.8 | 35.2% |

Figure 14:
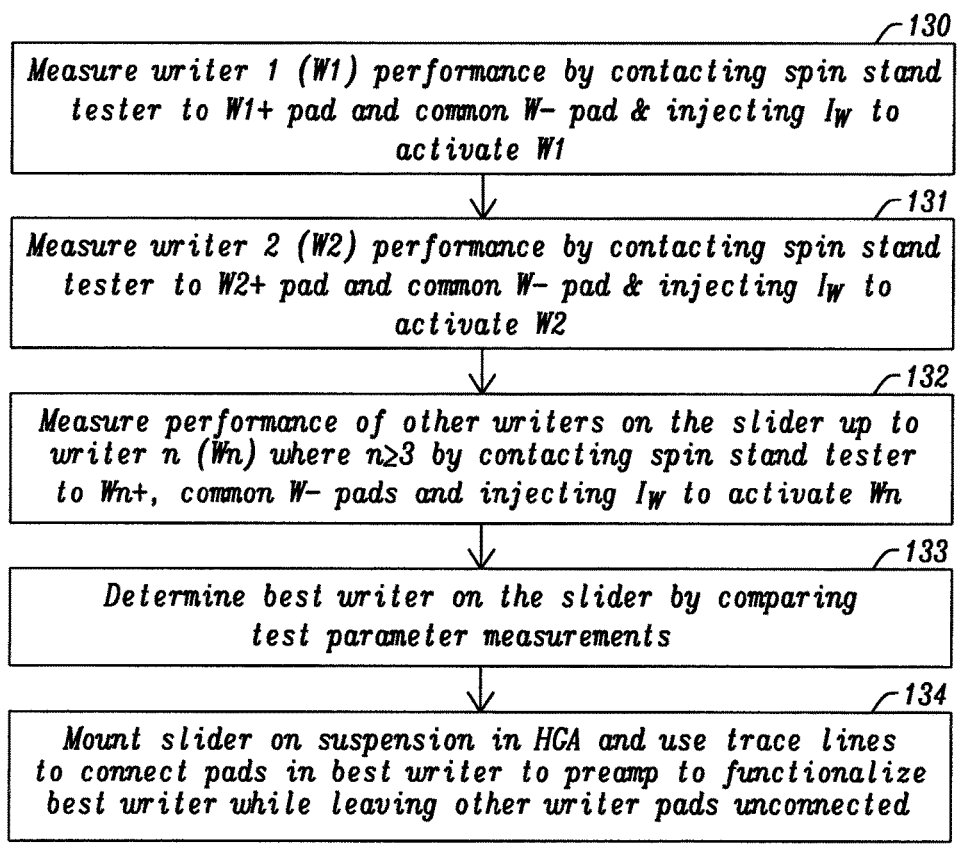
FIG. 14 is a flow diagram that depicts a series of steps used to select the best writer for a PMR writer design having a plurality of writers per slider where the writers share a common W− pad according to an embodiment described herein.

According to another embodiment of the present disclosure illustrated in FIG. 14, a test process comprised of steps 130-134 is utilized to determine the better writer in a dual PMR scheme, or the best writer in a PMR writer structure comprising a plurality of "n" writers on a slider, and where the writers share a common W– pad. In step 130, a spin stand test device with the special cartridge to enable selective probing of individual writers on a slider is used to determine the performance of the first writer by injecting a write current at W1+ pad 63a that passes through coils 61a, 60a, and exits at W– pad 64. As mentioned previously, in all embodiments described herein, the write current Iw may flow in the reverse direction from a W– pad to a W+ pad rather than from a W+ pad to a W– pad in order to activate a main pole in a selected writer. As a result of step 130, ADC measurements are collected and in some embodiments, BER and squeeze BER data is obtained as well for the first writer.

In step 131, the second writer is tested with the injection of a write current at W2+ pad 63b that flows through coils 61b, 60b and exits at W– pad 64 thereby energizing the main pole in the second writer. ADC measurements are taken, and optionally one or more measurements related to BER and squeeze BER.

Step 132 comprises spin stand testing each of the writers other than the first and second writers. For example, the nth writer is probed by injecting a write current at a Wn+ pad 63n that flows through coils 61n, 60n and exits at the W– pad 64 to energize the main pole in the nth writer. During the test, ADC measurements are taken, and optionally one or more measurements related to BER and squeeze BER. With a dual PMR writer, step 132 is omitted.

Thereafter, in step 133, the better writer in a dual PMR writer structure or the best writer in a multiple writer scheme with ≥3 writers per slider is determined by comparing spin stand measurements from each of the writers. Preferably, the writer that generates the best ADC results is considered to be the best writer on the slider.

In step 134, the slider is mounted on a suspension in a HGA. Only the writer pads that enable functionality in the better (or best) writer are connected to trace lines from a preamp as explained earlier and shown in FIGS. 9A-9B for a dual writer or in FIGS. 12A-12C for n writers on a slider. All other writers have open circuits to the preamp because of a gap between a writer pad and a trace line.

While the present disclosure has been particularly shown and described with reference to, the preferred embodiment thereof, it will be understood by those skilled in the art that various changes in form and details may be made without departing from the spirit and scope of this disclosure.

We claim:

1. A head gimbal assembly (HGA), comprising:
   (a) a slider on which a PMR writer structure is formed;
   (b) the PMR writer structure, comprising:
      (1) a first writer with a first main pole that is formed between a first bucking coil and a first driving coil; and
      (2) a second writer with a second main pole that is formed between a second bucking coil (DC) and a second driving coil (DC);
   (c) a plurality of nW+ pads on the slider, and comprised of a W1+ pad that is connected to the first DC, and a W2+ pad connected to the second DC, and a plurality of nW− pads formed on the slider, and comprising a W1− pad that is connected to the first BC, and a W2− pad connected to the second BC; and
   (d) a first trace line (TL1) from a preamp where the TL1 is formed on a flexure in the HGA and has a plurality of nTL1− arms wherein one TL1 arm is connected to one of the plurality of W− pads, and a second trace line (TL2) from the preamp where the TL2 is formed on the flexure and has a plurality of nTL2− arms wherein one TL2 arm is connected to one of the plurality of W+ pads thereby enabling only the first writer to be functional when the one TL1 arm is connected to the W1− pad and the one TL2 arm is connected to the W1+ pad, or only the second writer to be functional when the one TL1 arm is connected to the W2− pad and the one TL2 arm is connected to the W2+ pad.

2. The HGA of claim 1 wherein the PMR writer structure is further comprised of at least a nth writer (writer n) having an nth main pole formed between an nth BC and an nth DC where n is an integer≥3, and wherein the plurality of W+ pads further comprise a Wn+ pad connected to the nth DC, and wherein the plurality of W− pads further comprises a Wn− pad connected to the nth BC.

3. The HGA of claim 2 wherein only the nth writer is functional when the one TL1 arm is connected to the Wn− pad and the one TL2 arm is connected to the Wn+ pad.

4. The HGA of claim 1 wherein the first writer and the second writer have separate interconnects such that a first interconnect in the first writer enables a first write current to flow from the first BC to the first DC or from the first DC to the first BC to energize the first main pole when the first writer is functional, and a second interconnect in the second writer enables a second write current to flow from the second BC to the second DC or from the second DC to the second BC to energize the second main pole when the second writer is functional.

5. The HGA of claim 3 wherein each of the first writer, second writer, and nth writer has separate interconnects such that an nth interconnect in the nth writer enables an nth write current to flow from the nth BC to the nth DC or from the nth DC to the nth BC to energize the nth main pole when the nth writer is functional.

6. The HGA of claim 1 further comprising a suspension that supports the flexure and the slider, and wherein the suspension also comprises a load beam with one end connected to the flexure, and a base plate connected to the other end of the load beam.

7. A magnetic recording apparatus, comprising:
   (a) the HGA according to claim 1;
   (b) a magnetic recording medium positioned opposite to the slider;
   (c) a spindle motor that rotates and drives the magnetic recording medium; and
   (d) a device that supports the slider, and that positions the slider relative to the magnetic recording medium.

8. A head gimbal assembly (HGA), comprising:
   (a) a slider on which a PMR writer structure is formed;
   (b) the PMR writer structure, comprising:
      (1) a first writer with a first main pole that is formed between a first bucking coil and a first driving coil; and
      (2) a second writer with a second main pole that is formed between a second bucking coil (BC) and a second driving coil (DC);
   (c) a plurality of "-n-"+ pads on the slider, and comprised of a W1+ pad that is connected to the first DC, and a W2+ pad connected to the second DC, and a common W− pad formed on the slider wherein the common W− pad is connected to the first BC, and to the second BC; and
   (d) a first trace line (TL1) from a preamp where the TL1 is formed on a flexure in the HGA and has a plurality of TL1 arms wherein one TL1 arm is connected to one of the plurality of W+ pads, and a second trace line (TL2) from the preamp where the TL2 is formed on the flexure and is connected to the common W− pad thereby enabling only the first writer to be functional when the one TL1 arm is connected to the W1+ pad, or only the second writer to be functional when the one TL1 arm is connected to the W2+ pad.

9. The HGA of claim 8 wherein the PMR writer structure is further comprised of at least a nth writer (writer n) having an nth main pole formed between an nth BC and an nth DC where n is an integer≥3, and wherein the plurality of W+ pads further comprises a Wn+ pad connected to the nth DC, and wherein the common W− pad is connected to the nth BC.

10. The HGA of claim 9 wherein only the nth writer is functional when the one TL1 arm is connected to the Wn+ pad.

11. The HGA of claim 8 wherein the first writer and the second writer have separate interconnects such that a first interconnect in the first writer enables a first write current to flow from the first BC to the first DC or from the first DC to the first BC to energize the first main pole when the first writer is functional, and a second interconnect in the second writer enables a second write current to flow from the second BC to the second DC or from the second DC to the second BC to energize the second main pole when the second writer is functional.

12. The HGA of claim 10 wherein each of the first writer, second writer, and nth writer has separate interconnects such that an nth interconnect in the nth writer enables an nth write current to flow from the nth BC to the nth DC or from the nth DC to the nth BC to energize the nth main pole when the nth writer is functional.

13. The HGA of claim 8 further comprising a suspension that supports the flexure and slider and wherein the suspension also comprises a load beam with one end connected to the flexure, and a base plate connected to the other end of the load beam.

14. A magnetic recording apparatus, comprising:
(a) the HGA according to claim 8;
(b) a magnetic recording medium positioned opposite to the slider;
(c) a spindle motor that rotates and drives the magnetic recording medium; and
(d) a device that supports the slider, and that positions the slider relative to the magnetic recording medium.

15. A process for determining which of a plurality of writers in a PMR writer structure on a slider has better magnetic performance for subsequent integration in a head gimbal assembly (HGA), comprising:
(a) providing a spin stand test device having an attachment that enables sequential probing of individual writers in the PMR writer structure;
(b) measuring one or more test parameters for a first writer with the spin stand test device by injecting a first write current into a first bucking coil (BC) and through an interconnect to a first driving coil (DC) or in an opposite direction from the first DC to the first BC thereby energizing a first main pole in the first writer, and monitoring one or more test results including area density capability (ADC);
(c) measuring one or more test parameters for a second writer with the spin stand test device by injecting a second write current into a second BC and through an interconnect to a second DC or in an opposite direction from the second DC to the second BC thereby energizing a second main pole in the second writer, and monitoring one or more test results including ADC;
(d) comparing the one or more test parameter results for each of the first writer and second writer and determining which writer has better results; and
(e) integrating the slider in the HGA with a process comprised of connecting trace lines from a preamp in the HGA to the first writer to enable functionality therein when the first writer has the better results, or connecting the trace lines to the second writer to enable functionality therein when the second writer has the better results, and wherein the other of the first and second writer is disabled because of at least one gap between one of the trace lines and the other of the first or second writer.

16. The process flow of claim 15 wherein the trace lines comprise a first trace line (TL1) having two arms where one TL1 arm is joined to a W1+ pad that is connected to the first writer when the first writer has better results, or a second TL1 arm is joined to a W2+ pad that is connected to a second writer when the second writer has better results, and a second trace line (TL2) having two arms where one TL2 arm is joined to a W1− pad in the first writer when the first writer has the better results, or a second TL2 arm is joined to a W2− pad in the second writer when the second writer has the better results, and wherein the others of the TL1 arms and TL2 arms are not joined to any writer (W+ or W−) pads.

17. The process flow of claim 15 wherein the trace lines comprise a first trace line (TL1) that is joined to a common W− pad that is connected to the first writer and the second writer, and a second trace line (TL2) having two arms where one TL2 arm is joined to a W1+ pad in the first writer when the first writer has the better results, or a second TL2 arm is joined to a W2+ pad in the second writer when the second writer has the better results, and wherein the other of the TL2 arms is not joined to the W1+ pad or W2+ pad.

18. The process flow of claim 15 wherein the better result is determined based on which of the first writer and second writer has a better ADC result.

19. A process for determining which of a plurality of writers in a PMR writer structure on a slider, where n is an integer≥3, has better magnetic performance for subsequent integration in a head gimbal assembly (HGA), comprising:
(a) providing a spin stand test device having an attachment that enables sequential probing of individual writers in the PMR writer structure;
(b) measuring one or more test parameters for a first writer with the spin stand test device by injecting a first write current into a first bucking coil (BC) and through an interconnect to a first driving coil (DC) or in an opposite direction from the first DC to the first BC thereby energizing a first main pole in the first writer, and monitoring one or more test results including area density capability (ADC);
(c) measuring one or more test parameters for a second writer with the spin stand test device by injecting a second write current into a second BC and through an interconnect to a second DC or in an opposite direction from the second DC to the second BC thereby energizing a second main pole in the second writer, and monitoring one or more test results including ADC;
(d) measuring one or more test parameters for an nth writer with the spin stand test device by injecting an nth write current into an nth BC and through an interconnect to an nth DC or in an opposite direction from the nth DC to the nth BC thereby energizing an nth main pole in the nth writer, and monitoring one or more test results including ADC;
(e) comparing the one or more test parameter results for each of the plurality of "-n-" writers and determining which writer has a best performance; and
(f) integrating the slider in the HGA with a process comprised of connecting trace lines from a preamp in the HGA to the first writer to enable functionality therein when the first writer has the best performance, or connecting the trace lines to the second writer to enable functionality therein when the second writer has the best performance, or connecting the trace lines to the nth writer to enable functionality therein when the nth writer has the best performance, and wherein others of the plurality of "-n-" writers are disabled because of at least one gap between one of the trace lines and the others of the plurality of "-n-" writers.

20. The process flow of claim 19 wherein the trace lines comprise a first trace line (TL1) having a plurality of "-n-" arms where one TL1 arm is joined to a W1+ pad that is connected to the first writer when the first writer has the best performance, or a second TL1 arm is joined to a W2+ pad connected to a second writer when the second writer has the best performance, or an nth TL1 arm is joined to a Wn+ pad in the nth writer when the nth writer has the best performance, and a second trace line (TL2) having a plurality of "-n-" arms where one TL2 arm is joined to a W1− pad in the first writer when the first writer has the best performance, or a second TL2 arm is joined to a W2− pad in the second writer when the second writer has the best performance, or an nth TL2 arm is joined to a Wn− pad in the nth writer when the nth writer has the best performance, and wherein the other TL1 arms and TL2 arms are not joined to any writer (W+ or W−) pads.

21. The process flow of claim 19 wherein the trace lines comprise a first trace line (TL1) that is joined to a common W− pad that is connected to the first writer, to the second writer, and to the nth writer, and a second trace line (TL2) having a plurality of "-n-" arms where one TL2 arm is joined to a W1+ pad in the first writer when the first writer has the best performance, or a second TL2 arm is joined to a W2+ pad in the second writer when the second writer has the best performance, or an nth TL2 arm is joined to a Wn+ pad in the nth writer when the nth writer has the best performance, and wherein the other TL2 arms are not joined to any writer (W+) pad.

22. The process flow of claim 19 wherein the best performance is determined based on which of the plurality of "-n-" writers has a best ADC result.

* * * * *